United States Patent [19]
D'Souza et al.

[11] Patent Number: 5,606,270
[45] Date of Patent: Feb. 25, 1997

[54] DYNAMIC CLOCKED INVERTER LATCH WITH REDUCED CHARGE LEAKAGE

[75] Inventors: Godfrey P. D'Souza, Santa Clara; James F. Testa, Mountain View; Douglas A. Laird, Los Gatos; James B. Burr, Foster City, all of Calif.

[73] Assignee: Sun Microsystems, Inc., Mountain View, Calif.

[21] Appl. No.: 357,607

[22] Filed: Dec. 16, 1994

[51] Int. Cl.$^6$ .................................................. H03K 19/20
[52] U.S. Cl. ................................ 326/98; 326/95; 326/96; 326/121
[58] Field of Search ................................ 326/95, 96, 97, 326/98, 121

[56] References Cited

U.S. PATENT DOCUMENTS

| | | | |
|---|---|---|---|
| 4,780,626 | 10/1988 | Guerin | 326/121 |
| 5,208,489 | 5/1993 | Houston | 326/121 |
| 5,258,666 | 11/1993 | Furuki | 326/95 |
| 5,384,493 | 1/1995 | Furuki | 326/95 |

OTHER PUBLICATIONS

Mead et al., Intro to VLSI Systems, Oct. 1980, pp. 33–37.
Neil H. E. Weste and Kamran Eshraghian, "Principles of CMOS VLSI Design, A Systems Perspective", Second Edition, Addison–Wesley Publishing Company, 1993, pp. 298–302 and 308–311.
Saburo Muroga, "VLSI System Design, When and How to Design Very–Large–Scale Integrated Circuits", John Wiley & Sons, 1982, pp. 221–224.
Yasuhiko Tsukikawa, Takeshi Kajimoto, Yasuhiko Okasaka, Yoshikazu Morooka, Kiyohiro Furutani, Hiroshi Miyamoto and Hideyuki Ozaki, "An Efficient Back–Bias Generator with Hybrid Pumping Circuit for 1.5–V DRAM's", IEEE Journal of Solid–State Circuits, vol. 29, No. 4, Apr. 1994, pp. 534–538.
Ingemar Karlsson, "True Single Phase Clock Dynamic CMOS Circuit Technique", 1988 IEEE, pp. 475–478.
Yuan Ji–Ren, Ingemar Karlsson and Christer Svensson, "A True Single–Phase–Clock Dynamic CMOS Circuit Technique", IEEE Journal of Solid–State Circuits vol. SC–22, No. 5, Oct. 1987, pp. 899–901.
Jiren Yuan, Christer Svensson, "High–Speed CMOS Circuit Technique", IEEE Journal of Solid–State Circuits, vol. 24, No. 1, Feb. 1989, pp. 62.
Takeshi Sakata, Kiyoo Itoh, Masashi Horiguchi and Masakazu Aoki, "Subthreshold–Current Reduction Circuits for Multi–Gigabit DRAM's", IEEE Journal of Solid–State Circuits, vol. 29, No. 7, Jul. 1994, pp. 761–769.

(List continued on next page.)

Primary Examiner—Edward P. Westin
Assistant Examiner—Andrew Sanders
Attorney, Agent, or Firm—Limbach & Limbach L.L.P.

[57] ABSTRACT

A dynamic clocked inverter latch with reduced charge leakage includes a first node biasing circuit with a P-MOSFET and an N-MOSFET totem-pole-coupled between VDD and an output node, and a second node biasing circuit with another N-MOSFET and another P-MOSFET totem-pole-coupled between the output node and VSS. The first P-MOSFET receives an input data signal and the first N-MOSFET receives a clock signal and in accordance therewith together cause the output node to charge to a charged state having a charge voltage associated therewith. The second N-MOSFET also receives the input data signal while the second P-MOSFET receives the inverse of the clock signal and in accordance therewith together cause the output node to discharge to a discharged state having a discharge voltage associated therewith. During inactive states of the clock signal, the first N-MOSFET becomes reverse-biased by the output node discharge voltage, while during inactive states of the inverse clock signal, the second P-MOSFET becomes reverse-biased by the output node charge voltage, thereby virtually eliminating charge leakage to and from the output node, respectively.

24 Claims, 12 Drawing Sheets

OTHER PUBLICATIONS

Takeshi Sakata, Kiyoo Itoh, Masashi Horiguchi and Masakazu Aoki, "Two–Dimensional Power–Line Selection Scheme for Low Subthreshold–Current Multi–Gigabit DRAM's" IEEE Journal of Solid–State Circuits, vol. 29, No. 8, Aug. 1994, pp. 887–894.

Takayuki Kawahara, Masashi Horiguchi, Yoshiki Kawajiri, Goro Kitsukawa, Tokuo Kure and Masakazu Aoki, "Sub–threshold Current Reduction for Decoded–Driver by Self–Reverse Biasing", IEEE Journal of Solid–State Circuits, vol. 28, No. 11, Nov. 1993, pp. 1136–1144.

DYNAMIC CLOCKED INVERTER LATCH WITH REDUCED CHARGE LEAKAGE

BACKGROUND OF THE INVENTION

1. Field of the Invention

The present invention relates to dynamic logic circuits, and in particular, to dynamic logic circuits operating at low power supply voltages.

2. Description of the Related Art

Referring to FIG. 1, a conventional dynamic clocked inverter latch typically includes two totem-pole-coupled P-MOSFETs between VDD and the output signal node, and two totem-pole-coupled N-MOSFETs between VSS and the output signal node, as shown. The outer N-MOSFET and P-MOSFET devices receive the data input signal DIN, while the inner N-MOSFET and P-MOSFET devices receive the clock signal CLK and its inverse CLKB. Hence, in accordance with the logic level of the data input signal DIN, the output signal DOUT either charges to a logic 1 during the active (low) state of the inverse clock signal CLKB or discharges to a logic 0 during the active (high) state of the clock signal CLK. Referring to FIG. 1A, this operation can be graphically represented as shown.

As MOSFET technology has evolved, individual MOSFETs have become steadily smaller, e.g. with smaller feature sizes, particularly shorter channel lengths. This has allowed more and more MOSFETs to be integrated together in one integrated circuit (IC), as well as allow the requisite power supply voltage (VDD) to become smaller as well. Benefits of the former include reduced size and increased operating frequencies, while benefits of the latter include reduced power consumption. However, operating MOSFETs at today's lower power supply voltages has the undesirable effect of lowering MOSFET current which reduces the maximum operating frequency. Hence, in order to minimize reductions in circuit performance, the MOSFET threshold voltages ($V_{TH}$) are reduced so as to minimize reductions in the MOSFET current. (Further discussion of the relationship(s) between power supply voltage, threshold voltage and operating performance for MOSFETs can be found in commonly assigned, copending U.S. patent application Ser. No. 08/292,513, filed Aug. 18, 1994, and entitled "Low Power, High Performance Junction Transistor", the disclosure of which is hereby incorporated herein by reference.) However, this in turn has the undesired effect of increasing MOSFET leakage current, i.e. MOSFET current flowing when the device is turned off. This results in charges leaking to and from the dynamic node(s) of each logic cell which prevents dynamic output signal levels from maintaining their full dynamic charge and discharge voltage levels, thereby decreasing noise immunity and increasing chances of failure due to data losses caused by undesired charges leaking into or desired charges leaking out of the dynamic nodes. Referring to FIG. 1B, the results of such charge leakage in the circuit of FIG. 1 can be graphically represented as shown.

Referring to FIG. 2, an alternative conventional dynamic clocked inverter latch is similar to that of FIG. 1, but with the inputs for the data input signal DIN exchanged with those for the clock signals CLK, CLKB. As with the latch of FIG. 1, this latch also suffers from the effects of increased, undesirable charge leakages when the MOSFET threshold voltages are reduced. However, this latch further suffers from "charge sharing", i.e. the undesired transfer of charges from the dynamic output node to the node between the drain terminals of the P-MOSFETs or the N-MOSFETs when the data input signal DIN is low or high, respectively, during inactive states of the clock signals CLK, CLKB.

Accordingly, it would be desirable to have a dynamic clocked inverter latch with transistors having reduced threshold voltages so as to take maximum advantage of the benefits available from the use of lower power supply voltages while simultaneously minimizing chances of failure due to data losses caused by charge leakage to or from dynamic data storage nodes, minimizing reductions in maximum operating frequency and providing for improved noise immunity.

SUMMARY OF THE INVENTION

In accordance with the present invention, dynamic latching of data can be done at very low voltages with virtually no charge leakage by using latches having transistors with reduced threshold voltages so as to take maximum advantage of the power-saving benefits available with the use of lower power supply voltages (e.g. less than 3.5 volts) while simultaneously minimizing chances of failure due to data losses caused by charge leakage to or from data storage nodes, minimizing reductions in maximum operating frequency and providing for improved noise immunity. Self reverse biasing of circuit elements which can otherwise form potential leakage paths is done with inherent dynamic signal levels, thereby isolating and maintaining dynamic charge levels at the signal nodes of interest.

An apparatus with a dynamic clocked inverter latch having reduced charge leakage in accordance with one embodiment of the present invention includes first and second supply nodes, a signal node and first and second circuits. The first and second supply nodes are for operating at first and second voltage levels, respectively. The first circuit is coupled between the signal node and the first supply node for receiving a first data signal and a first clock signal with first active and inactive clock states and in response thereto coupling the signal node to the first supply node at the first voltage level during the first active clock state. The second circuit is coupled between the signal node and the second supply node for substantially maintaining the first voltage level at the signal node when the first clock signal transitions from the first active clock state to the first inactive clock state.

These and other features and advantages of the present invention will be understood upon consideration of the following detailed description of the invention and the accompanying drawings.

DETAILED DESCRIPTION OF THE INVENTION

Figure 1:
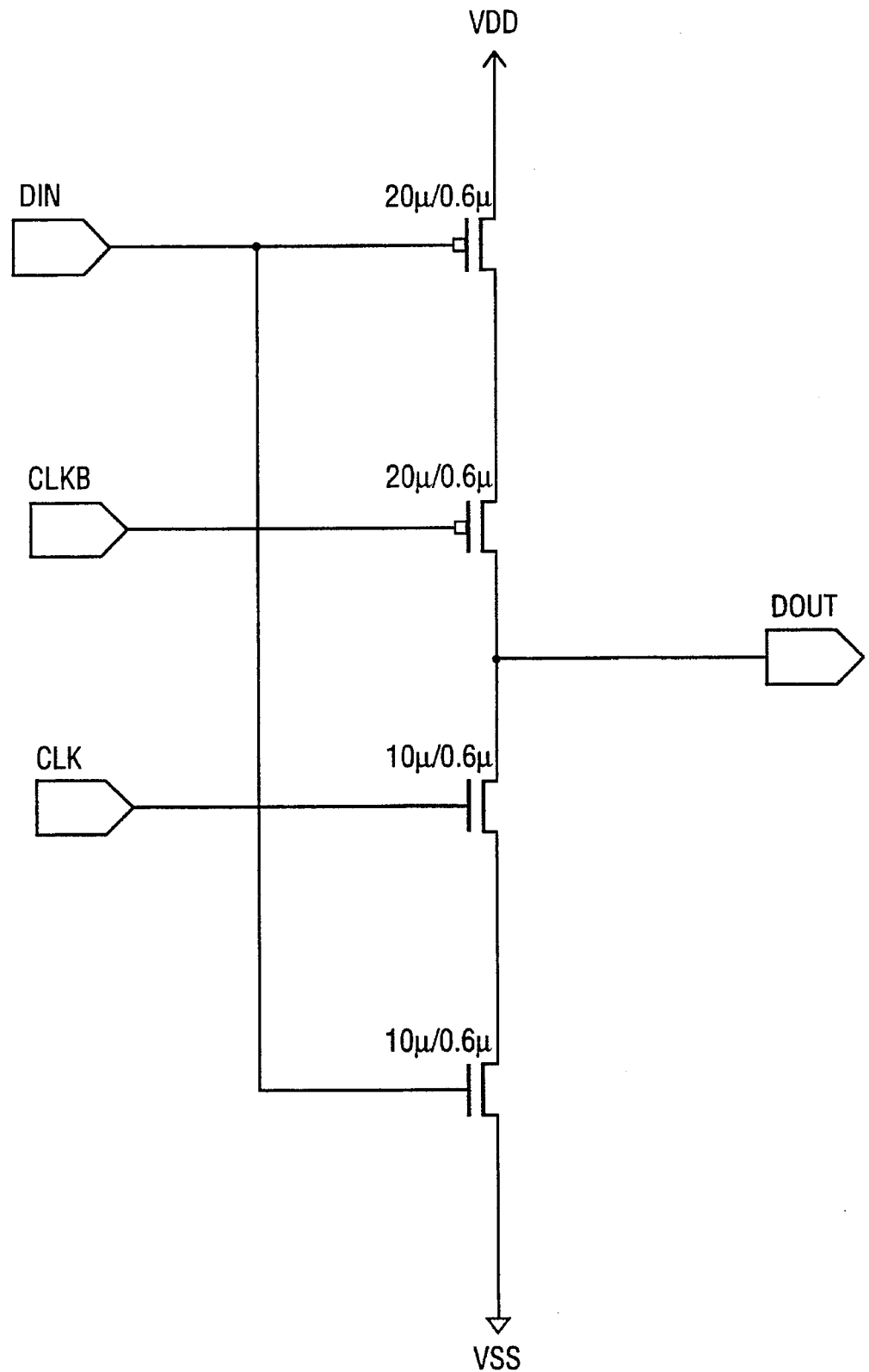
FIG. 1 is a schematic diagram of a conventional dynamic clocked inverter latch.
Figure 1A:
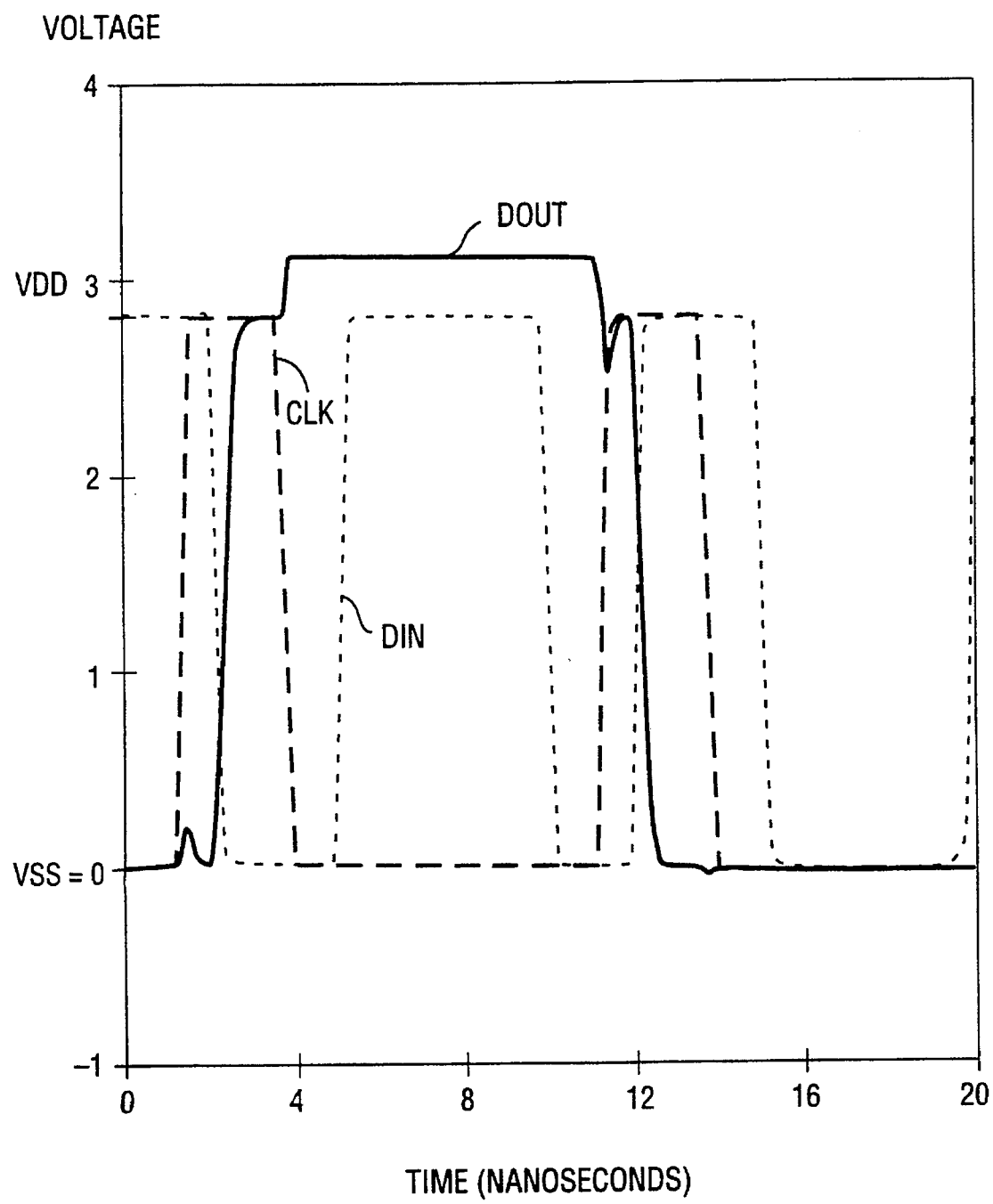
FIG. 1A is a voltage versus time plot of clock, input and output signals for the circuit of FIG. 1.
Figure 1B:
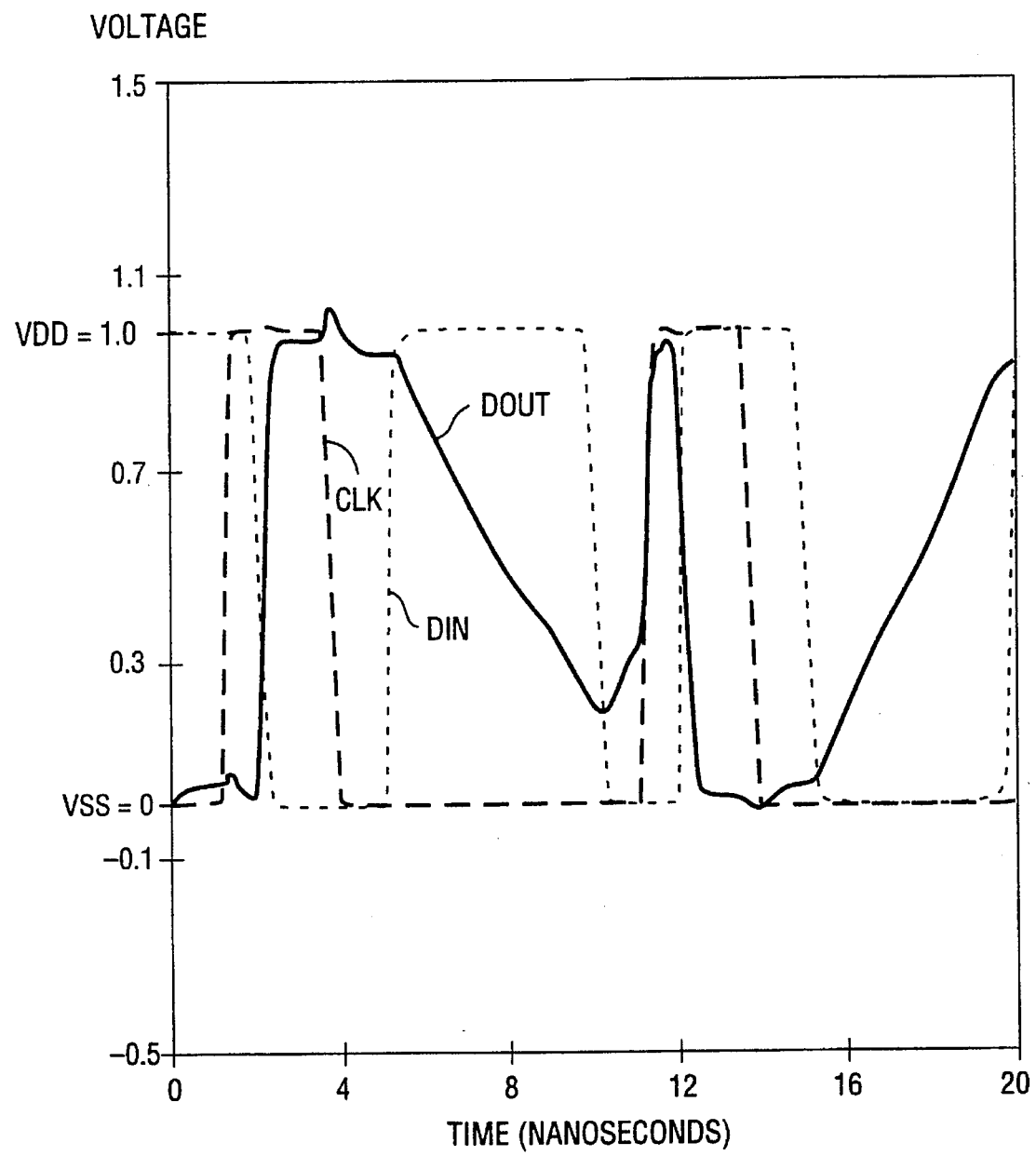
FIG. 1B is a voltage versus time plot of clock, input and output signals for the circuit of FIG. 1 while operating at a reduced power supply voltage with conventional MOSFET threshold voltages.
Figure 2:
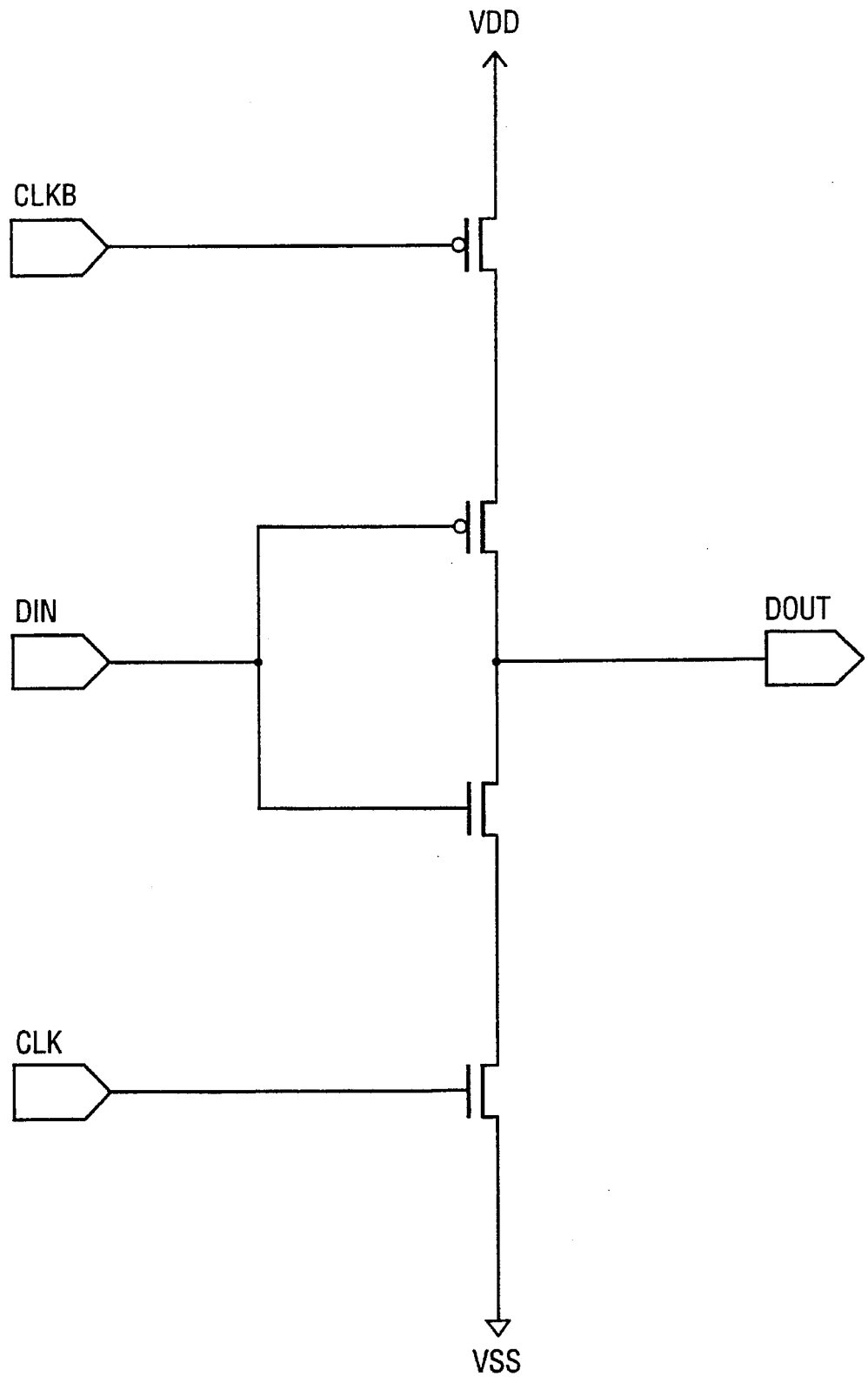
FIG. 2 is a schematic diagram of an alternative, conventional dynamic clocked inverter latch.

Throughout the following discussion, unless indicated otherwise, it is assumed that all P-MOSFET and N-MOSFET substrates (or "bulks") are connected to their respective, associated power supply terminals (e.g. typically to power supply nodes VDD and VSS, respectively). Also, the alphanumeric legends alongside the various transistors indicate their respective channel widths and lengths. (For example, the widths and lengths of the P-MOSFETs in FIG. 1 are 20 microns and 0.6 microns, respectively.) It should be understood that such dimensions are intended to be exemplary only and are not intended to require or be limited to any specific semiconductor processing technology, and as semiconductor processing technology advances further such dimensions may be altered, e.g. reduced, as desired. (For example, it should be understood that fabrication of circuitry embodying the present invention can be done in accordance with many well known semiconductor processes or alternatively, in accordance with those processes discussed in the aforementioned U.S. patent application Ser. No. 08/292,513 or commonly assigned, copending U.S. patent application Ser. No. 08/357,436, filed Dec. 16, 1994, and entitled "Asymmetric Low Power MOS Devices", the disclosures of which are both hereby incorporated herein by reference.) Further, it is assumed that the circuit reference, or ground, node is the VSS terminal (typically with an associated reference, or ground, voltage potential of 0 volts).

In the following discussion, a specific example of a dynamic clocked inverter latch with self reverse biasing is discussed. However, it should be understood that additional dynamic logic circuits (e.g. AND, OR, NOR, NAND, EXCLUSIVE-OR, EXCLUSIVE-NOR, etc.) can also be realized using self reverse biasing to prevent charge leakage in accordance with the present invention. Furthermore, the following discussion is primarily in terms of "positive" logic, i.e. where a logic 1 is a logic "high" (e.g. a positive voltage) and a logic 0 is a logic "low" (e.g. approximately equal to the circuit reference potential). However, as discussed further below, it should be understood that dynamic logic circuits with self reverse biasing to prevent charge leakage in accordance with the present invention can be used with "negative" logic as well (i.e. where a logic 1 is a logic "low", e.g. a negative voltage, and a logic 0 is a logic "high", e.g. approximately equal to the circuit reference potential), with P-MOSFETs and N-MOSFETs interchanged as appropriate in accordance with well known circuit design principles.

Figure 3:
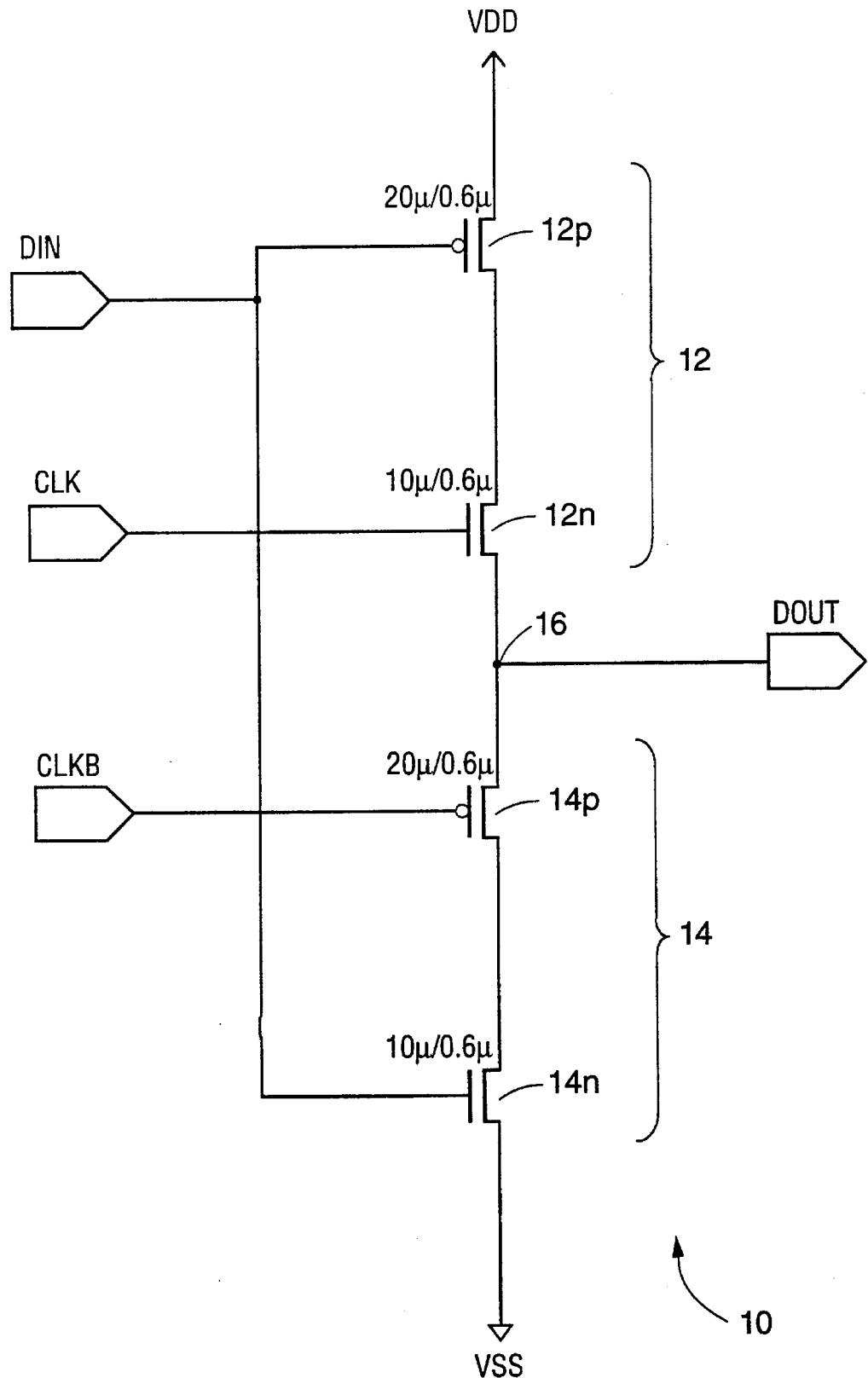
FIG. 3 is a schematic diagram of a dynamic clocked inverter latch with reduced charge leakage in accordance with one embodiment of the present invention.

Referring to FIG. 3, a dynamic clocked inverter latch circuit 10 in accordance with one embodiment of the present invention includes two node biasing circuits 12, 14 connected to an output signal node 16. In the first node biasing circuit 12, a P-MOSFET 12p and N-MOSFET 12n are totem-pole-connected via their drain terminals with the P-MOSFET 12p source terminal connected to VDD and the N-MOSFET 12n source terminal connected to the output node 16. The P-MOSFET 12p gate terminal receives the data input signal DIN while the N-MOSFET 12n gate terminal receives the clock signal CLK whose active and inactive states correspond to logic states 1 and 0, respectively. In the second node biasing circuit 14, a P-MOSFET 14p and N-MOSFET 14n are totem-pole-connected via their drain terminals with the P-MOSFET 14p source terminal connected to the output signal node 16 and the N-MOSFET 14n source terminal connected to VSS. The N-MOSFET 14n gate terminal also receives the data input signal DIN while the P-MOSFET 14p gate terminal receives the inverse clock signal CLKB which is the inverse of the primary clock signal CLK and whose active and inactive states correspond to a logic 0 and 1, respectively.

When both clock signals CLK, CLKB are active (CLK=high and CLKB=low), the upper N-MOSFET 12n and lower P-MOSFET 14p are both turned on. Accordingly, the voltage at the output node 16 representing the output signal DOUT will be the inverse of the data input signal DIN due to the signal inverting action of the upper P-MOSFET 12p and lower N-MOSFET 14n. Hence, if the data input DIN is a logic 0, both MOSFETs 12p, 12n of the first node biasing circuit 12 are forward biased, while the second node biasing circuit 14 is turned off. Hence, the first node biasing circuit 12 conducts electrical charges from VDD to the signal node 16 to charge it up to a charge voltage substantially equal to VDD, i.e. =VDD-$V_{TH(N)}$ or =VDD for positive or negative N-MOSFET threshold voltages $V_{TH(N)}$, respectively. Conversely, if the data input DIN is a logic 1, both MOSFETs 14p, 14n of the second node biasing circuit 14 are forward biased, while the first node biasing circuit 12 is turned off. This results in electrical charges from the output node 16 being conducted to VSS, e.g. circuit ground, thereby causing the output node 16 to discharge to a discharge voltage substantially equal to VSS, i.e. =VSS-$V_{TH(P)}$ or =VSS for negative or positive P-MOSFET threshold voltages $V_{TH(P)}$, respectively.

Once the output node 16 has charged or discharged to its charge or discharge voltage, respectively, and the clock signals CLK, CLKB become inactive (CLK=low and CLKB=high), the self-reverse biasing action of the circuit 10 in accordance with the present invention begins. For example, when the data input signal DIN is a logic 0, thereby causing the output node 16 to charge to a charge voltage approximately equal to VDD, the MOSFETs 14p, 14n of the lower node biasing circuit 14, even though turned off, will nonetheless conduct a small amount of leakage current, i.e. electrical charge, from node 16 to VSS. This will cause the node voltage at node 16 to drop. However, as the node 16 voltage begins to drop, the gate-to-source voltage of the lower P-MOSFET 14p becomes increasingly positive since the inverse clock signal CLKB is at a logic 1, i.e. in its inactive state. This causes the P-MOSFET 14p to become reversed biased, thereby preventing any further charge leakage through the P-MOSFET 14p. Accordingly, the node 16 voltage stabilizes and stops decreasing.

Similarly, when the data input, signal DIN is a logic 1, the output node 16 discharges to a discharge voltage approximately equal to VSS when the clock signals CLK, CLKB are in their active states. After the clock signals CLK, CLKB become inactive, some small amount of leakage current, i.e. electrical charge, begins to flow through the MOSFETs 12p, 12n of the upper node biasing circuit 12 to the output node 16, thereby causing the output node 16 voltage to rise slightly from VSS. However, since the primary clock signal CLK is at a logic 0 in its inactive state, any rise in the output node 16 voltage causes the gate-to-source voltage of the N-MOSFET 12n to become increasingly negative. This causes the N-MOSFET 12n to become reversed biased, thereby preventing any further charge leakage through the N-MOSFET 12n. Accordingly, the node 16 voltage stabilizes and stops increasing.

Figure 3A:
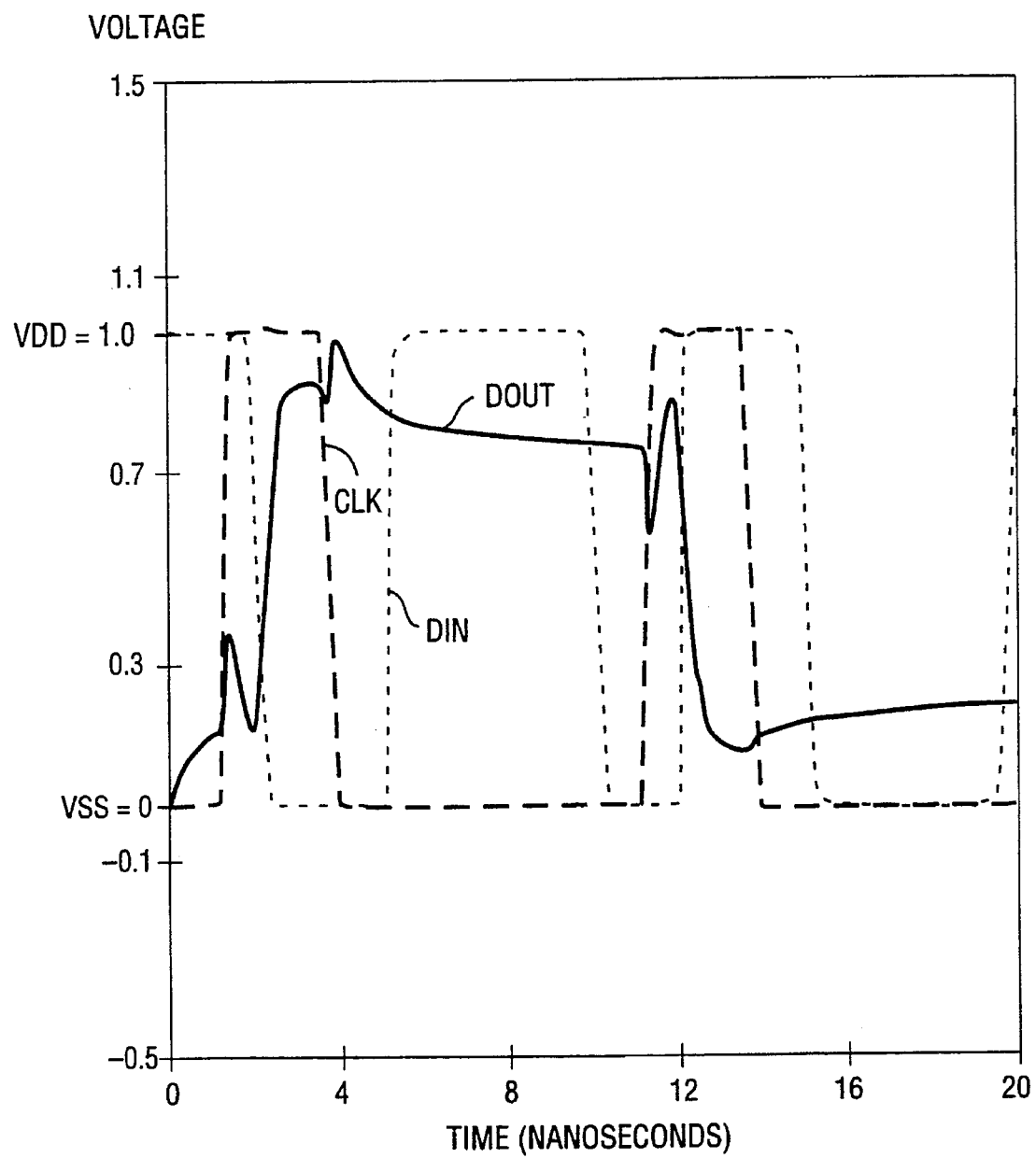
FIG. 3A is a voltage versus time plot of clock, input and output signals for the circuit of FIG. 3 while operating at a reduced power supply voltage with reduced MOSFET threshold voltages.

Referring to FIG. 3A, the above-discussed operation of the circuit of FIG. 3 can be better understood. As shown, when the data input signal DIN is a logic 0 and the clock signal CLK is active, the output signal DOUT rises to approximately VDD. Subsequently, after the clock signal CLK has become inactive, the output signal DOUT decreases slightly as the output node 16 discharges slightly. However, this discharging action soon ceases due to the reverse bias appearing across the N-MOSFET 12n. Conversely, when the data input signal DIN is a logic 1 and the clock signal CLK is active, the output voltage DOUT discharges to a value substantially equal to VSS. Subsequently, after the clock signals CLK, CLKB have become inactive, the output voltage DOUT increases slightly as the output node 16 begins to recharge slightly due to leakage current. However, this charging action ceases once the P-MOSFET 14p has become reverse biased.

Figure 4:
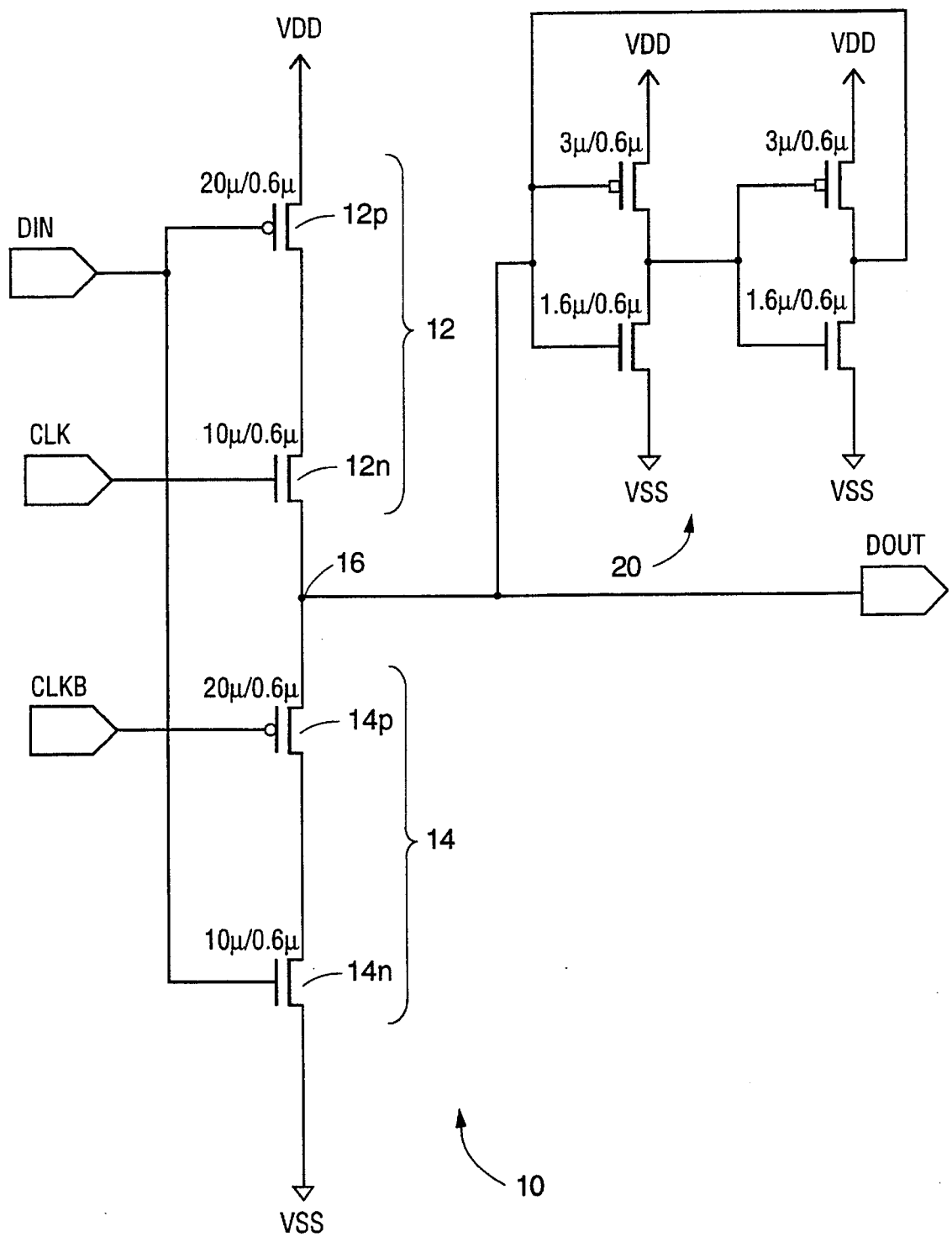
FIG. 4 is a schematic diagram of the circuit of FIG. 3 with an output level restoration circuit added.
Figure 4A:
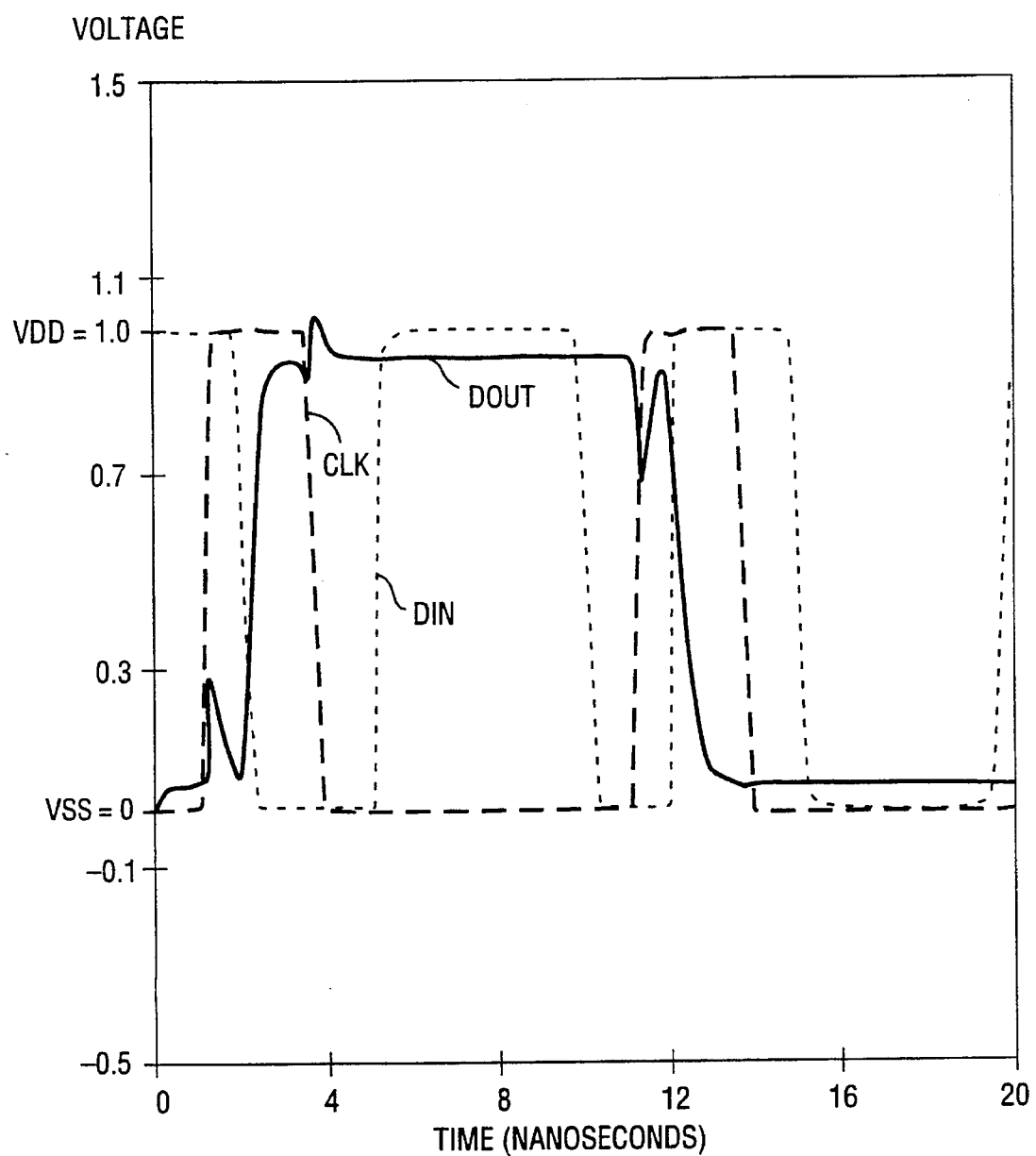
FIG. 4A is a voltage versus time plot of clock, input and output signals for the circuit of FIG. 4.

Referring to FIG. 4, the waveforms shown in FIG. 3A can be improved by adding a level restoration circuit 20 and connecting it to the output node 16, as shown. When the output node 16 charges or discharges to its high or low states, respectively, the positive feedback action of the level restoration circuit 20 applies a pull-up or pull-down voltage, respectively, to the output node 16. Any leakage currents flowing into or out of node 16 are instead sunk or sourced by the output N-MOSFET or P-MOSFET devices of the level restoration circuit 20, respectively. Referring to FIG. 4A, the resulting improvement in the output voltage DOUT can be seen.

Figure 5:
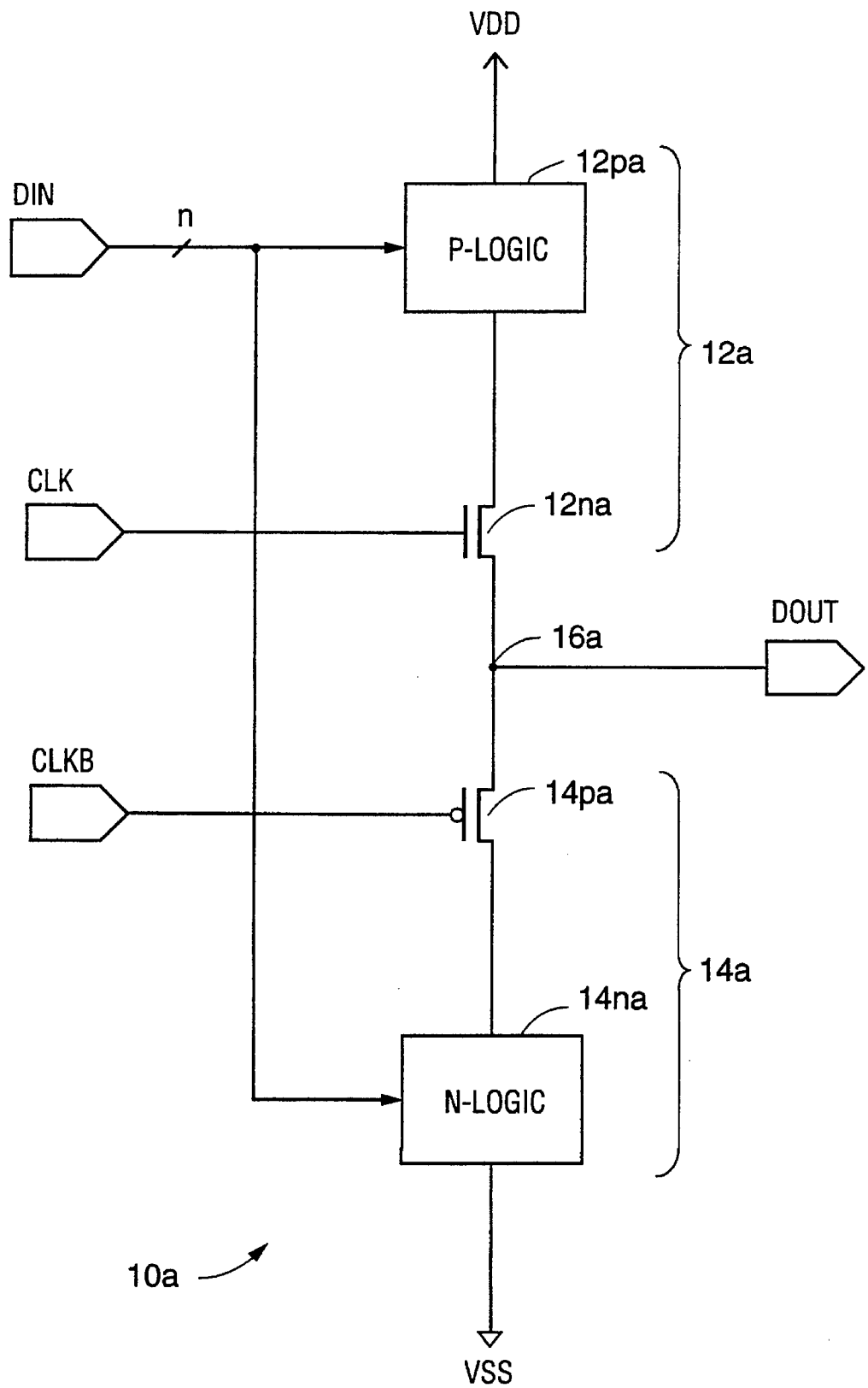
FIG. 5 is a functional block and schematic diagram of a dynamic clocked logic amplifier circuit with reduced charge leakage in accordance with another embodiment of the present invention.

Referring to FIG. 5, a dynamic clocked logic amplifier circuit 10a in accordance with another embodiment of the present invention includes two node biasing circuits 12a, 14a connected to an output signal node 16a. The operation of this circuit 10a is generally in accordance with the foregoing discussion for the circuit 10 of FIG. 3. However, instead of single MOSFETs 12p, 14n for processing the data input signal DIN, more complex P-logic and N-logic subcircuits 12pa, 14na are used for processing a multibit data input signal DIN. Accordingly, the logic function to be performed by the logic amplifier circuit 10a can be selected as desired in accordance with well known design principles.

Figure 6:
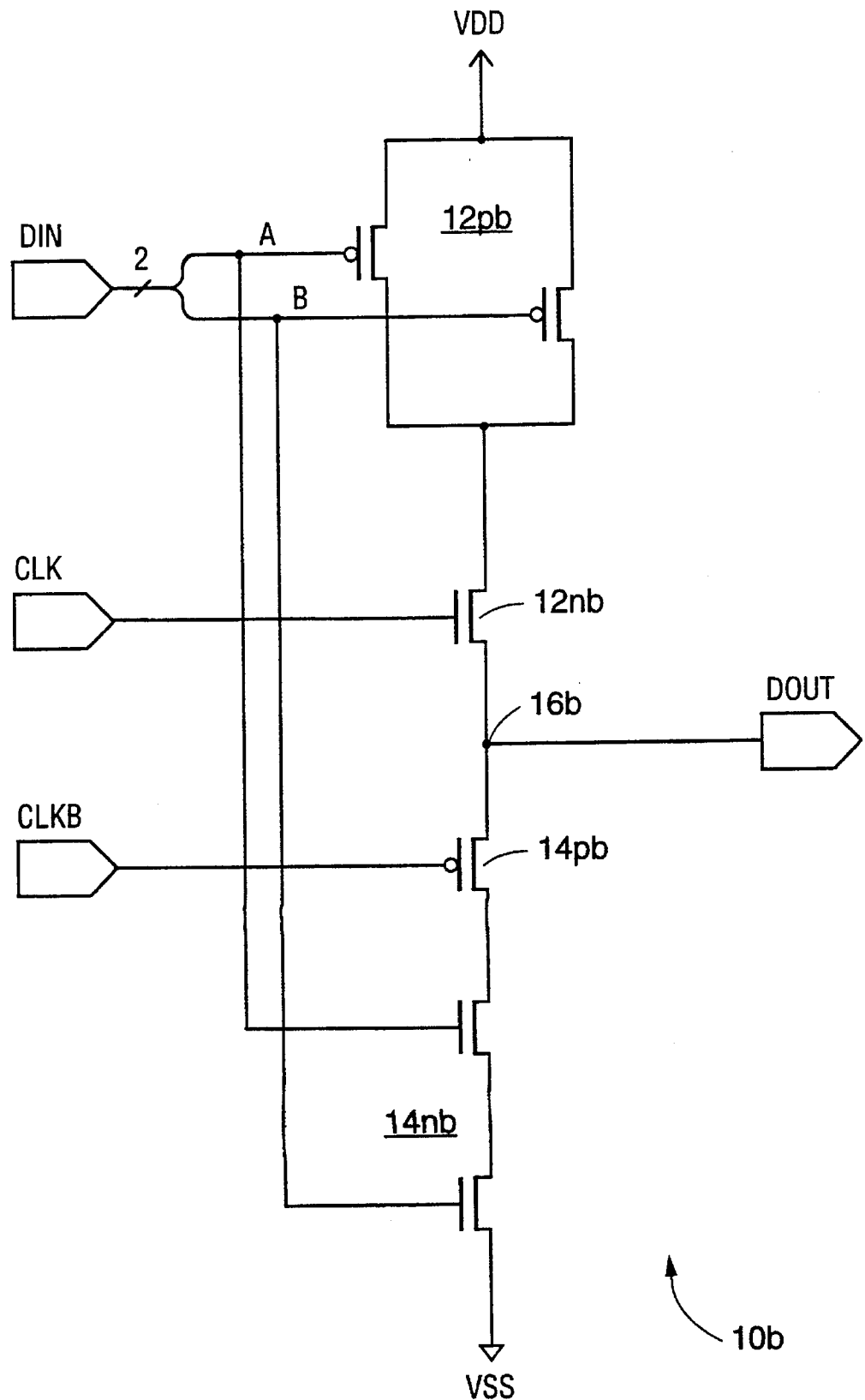
FIG. 6 is a schematic diagram of an exemplary circuit for the dynamic clocked logic amplifier circuit of FIG. 5.

Referring to FIG. 6, for example, a two-input NAND gate circuit 10b, based upon the general logic amplifier circuit 10a of FIG. 5, can be implemented as shown. The multibit data input signal DIN includes logic signals A and B which are logically NANDed in the P-MOSFET and N-MOSFET devices forming the P-logic 12pb and N-logic 14nb subcircuits, respectively.

Figure 7:
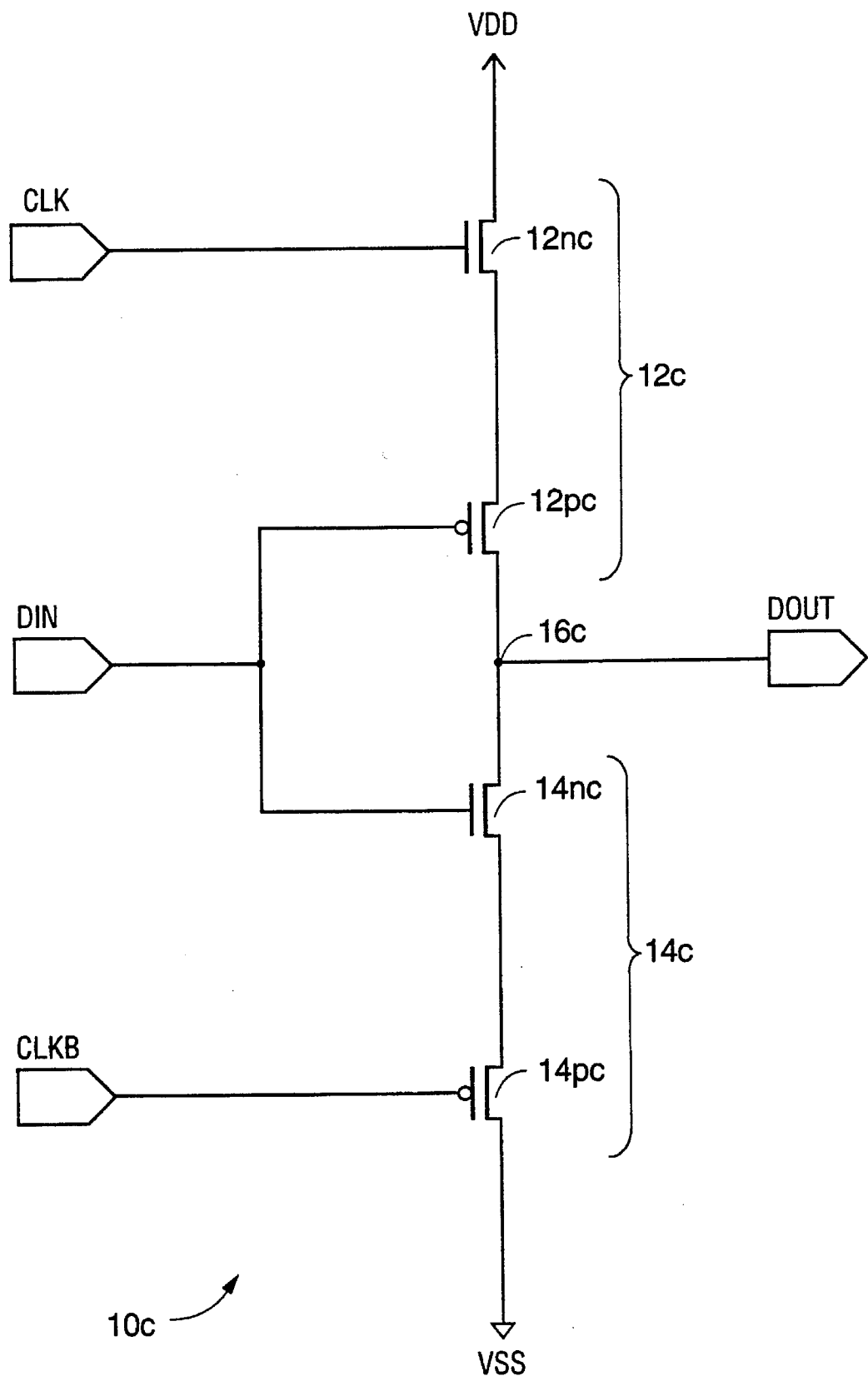
FIG. 7 is a schematic diagram of a dynamic clocked inverter latch with reduced charge leakage in accordance with another embodiment of the present invention.

Referring to FIG. 7, an alternative dynamic clocked logic amplifier circuit 10c in accordance with another embodiment of the present invention includes two node biasing circuits 12c, 14c connected to an output signal node 16c. The configuration of this circuit 10c is generally in accordance with that of FIG. 3 with the exception that, while their series connections are maintained, the relative positions of the P-MOSFETs 12pc, 14pc and N-MOSFETs 12nc, 14nc within their respective node biasing circuits 12c, 14c are reversed. In accordance with the foregoing discussion for the circuit 10 of FIG. 3, the N-MOSFET 12nc and P-MOSFET 14pc responsible for processing the clock signals CLK, CLKB become reverse-biased during the inactive states of the clock signals CLK, CLKB, thereby preventing undesired charging or discharging of the dynamic signal node 16c due to undesired leakage currents. (One potential drawback of this particular circuit 10c, however, is that of "charge sharing" where some charges from the dynamic signal node 16c may transfer to either the node connecting the source terminals of P-MOSFET 12pc and N-MOSFET 12nc in the first node biasing circuit 12c or the node connecting the source terminals of P-MOSFET 14pc and N-MOSFET 14nc in the second node biasing circuit 14c when the data input signal DIN is low or high, respectively, during inactive states of the clock signals CLK, CLKB.)

In accordance with the foregoing discussion, it should be understood that logic circuits with reduced charge leakage in accordance with the present invention can also be realized for operation with negative logic. For example, negative logic implementations of the exemplary logic circuit 10 of FIGS. 3 and 4 can be realized by using negative logic clock CLK/CLKB and input logic signals DIN, and replacing the N-MOSFETs 12n, 14n and P-MOSFETs 12p, 14p forming the logic circuit 10 with P-MOSFETs and N-MOSFETs, respectively. By discussing charge and current flow in terms of "electron" charge/current flow (i.e. negative-to-positive) instead of in terms of "conventional" charge/current flow (i.e. positive-to-negative) as done above, the operation of such negative logic implementations can then be described in accordance with the foregoing discussion, e.g. with node 16 "charging" to VSS and then conditionally "discharging" to VDD.

Figure 8:
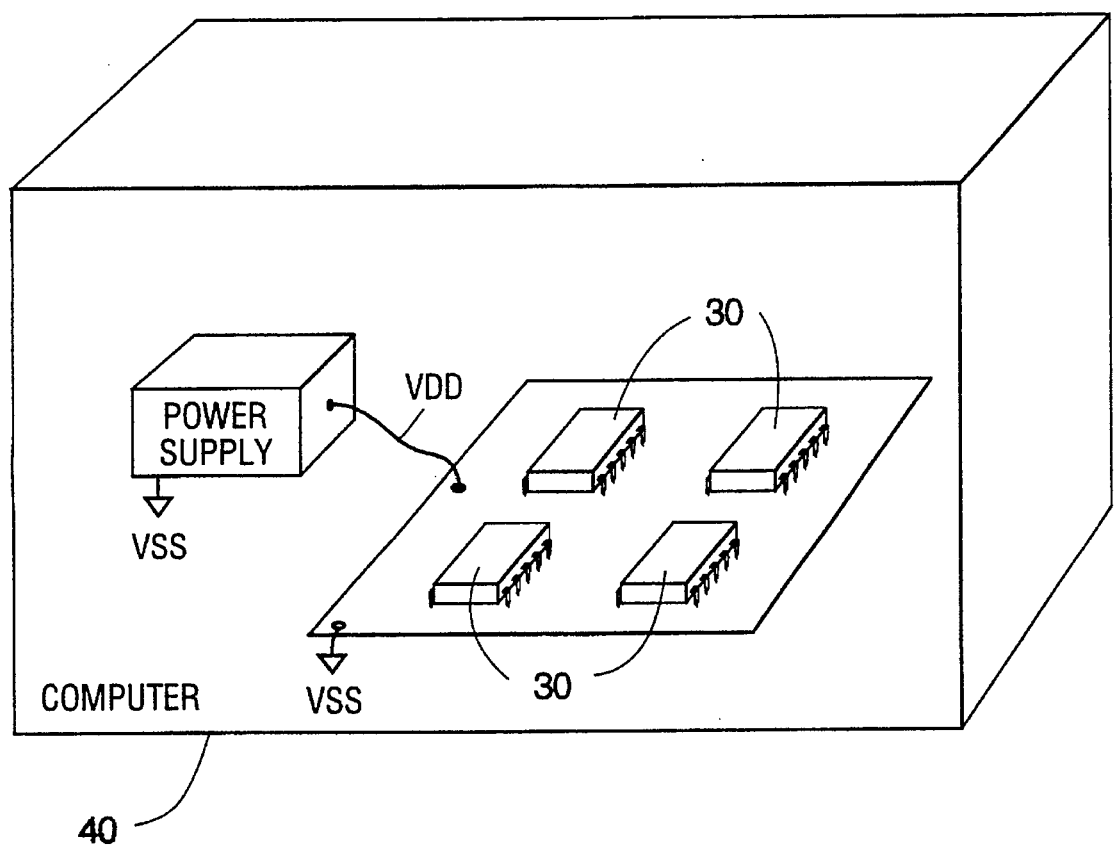
FIG. 8 represents the integration of a dynamic clocked inverter latch with reduced charge leakage in accordance with the present invention within an integrated circuit and the incorporation thereof within a computer.

Referring to FIG. 8, a dynamic clocked inverter latch having reduced charge leakage in accordance with the present invention (e.g. circuits 10, 10a, 10b or 10c of FIGS. 3, 5, 6 or 7, respectively) can be used perhaps most advantageously when integrated within an integrated circuit (IC) 30. In accordance with the foregoing discussion, the IC 30 can be designed to have a number of such dynamic circuits 10 integrated therein with transistors having reduced threshold voltages so as to take maximum advantage of the power-saving benefits available with the use of lower power supply voltages (e.g. less than 3 volts) while simultaneously minimizing chances of failure due to data losses caused by charge leakage to or from data storage nodes, minimizing reductions in maximum operating frequency and providing for improved noise immunity. For example, by incorporating a number of such ICs 30 into a computer 40, the system power supply requirements (e.g. output power levels, filtering, etc.) and system cooling requirements (e.g. fan size and power, quantities and sizes of heat sinks, air filters, etc.) can be relaxed, thereby resulting in a lighter, cooler-operating system.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a dynamic logic circuit, said dynamic logic circuit comprising:

a first supply node for operating at a first voltage level;

a second supply node for operating at a second voltage level;

a signal node;

a first circuit, coupled between said signal node and said first supply node, for receiving a first data signal and a first clock signal with first active and inactive clock states and in response thereto coupling said signal node to said first supply node at said first voltage level during said first active clock state; and a second circuit, coupled between said signal node and said second supply node, for becoming reversed biased and thereby substantially maintaining said first voltage level at said signal node when said first clock signal transitions from said first active clock state to said first inactive clock state.

2. An apparatus as recited in claim 1, wherein said second circuit is further for receiving a second data signal and a second clock signal with second active and inactive clock states and in response thereto coupling said signal node to said second supply node at said second voltage level during said second active clock state, and wherein said first circuit is further for becoming reversed biased and thereby substantially maintaining said second voltage level at said signal node when said second clock signal transitions from said second active clock state to said second inactive clock state.

3. An apparatus as recited in claim 2, wherein said first and second circuits together implement one of the following logic functions: inversion; AND; OR; NAND; NOR; EXOR; and EXNOR.

4. An apparatus as recited in claim 1, wherein said first circuit comprises a P-MOSFET with drain and source terminals coupled between said signal node and said first supply node.

5. An apparatus as recited in claim 4, wherein said P-MOSFET includes a gate terminal for receiving said first data signal.

6. A method of providing an apparatus including a dynamic logic circuit, said method comprising the steps of:

providing a first supply node for operating at a first voltage level;

providing a second supply node for operating at a second voltage level;

providing a signal node;

providing a first circuit, coupled between said signal node and said first supply node, for receiving a first data signal and a first clock signal with first active and inactive clock states and in response thereto coupling said signal node to said first supply node at said first voltage level during said first active clock state; and providing a second circuit, coupled between said signal node and said second supply node, for becoming reversed biased and thereby substantially maintaining said first voltage level at said signal node when said first clock signal transitions from said first active clock state to said first inactive clock state.

7. A method of dynamically processing a logic signal, said method comprising the steps of:

operating a first supply node at a first voltage level;

operating a second supply node at a second voltage level;

receiving a first data signal and a first clock signal with first active and inactive clock states and in response thereto coupling a signal node which is between said first and second supply nodes to said first supply node at said first voltage level during said first active clock state; and reversed biasing and thereby substantially maintaining said first voltage level at said signal node when said first clock signal transitions from said first active clock state to said first inactive clock state.

8. An apparatus including a dynamic logic circuit, said dynamic logic circuit comprising:

a first supply node for operating at a first voltage level;

a second supply node for operating at a second voltage level;

a signal node;

a first circuit, coupled between said signal node and said first supply node, for receiving a first data signal and a first clock signal with first active and inactive clock states and in response thereto coupling said signal node to said first supply node at said first voltage level during said first active clock state; and a second circuit, coupled between said signal node and said second supply node, for becoming reversed biased and thereby substantially maintaining said first voltage level at said signal node when said first clock signal transitions from said first active clock state to said first inactive clock state, wherein said second circuit comprises a P-MOSFET which is biased off when said signal node is at said first voltage level and said first clock signal transitions from said first active clock state to said first inactive clock state.

9. An apparatus including a dynamic logic circuit, said dynamic logic circuit comprising:

a first supply node for operating at a first voltage level;

a second supply node for operating at a second voltage level;

a signal node;

a first circuit, coupled between said signal node and said first supply node, for receiving a first data signal and a first clock signal with first active and inactive clock states and in response thereto coupling said signal node to said first supply node at said first voltage level during said first active clock state, wherein said first circuit comprises an N-MOSFET with drain and source terminals coupled between said signal node and said first supply node; and a second circuit, coupled between said signal node and said second supply node, for becoming reversed biased and thereby substantially maintaining said first voltage level at said signal node when said first clock signal transitions from said first active clock state to said first inactive clock state.

10. An apparatus including a dynamic logic circuit, said dynamic logic circuit comprising:

a first supply node for operating at a first voltage level;

a second supply node for operating at a second voltage level;

a signal node;

a first circuit, coupled between said signal node and said first supply node, for receiving a first data signal and a first clock signal with first active and inactive clock states and in response thereto coupling said signal node to said first supply node at said first voltage level during said first active clock state; and a second circuit, coupled between said signal node and said second supply node, for becoming reversed biased and thereby substantially maintaining said first voltage level at said signal node when said first clock signal transitions from said first active clock state to said first inactive clock state, wherein said second circuit comprises an N-MOSFET which is biased off when said signal node is at said first voltage level and said first clock signal transitions from said first active clock state to said first inactive clock state.

11. An apparatus as recited in claim 8, wherein said P-MOSFET includes drain and source terminals coupled between said signal node and said second supply node.

12. An apparatus as recited in claim 8, wherein said P-MOSFET includes a gate terminal for receiving a complement of said first clock signal.

13. An apparatus as recited in claim 9, wherein said N-MOSFET includes a gate terminal for receiving said first data signal.

14. An apparatus as recited in claim 10, wherein said N-MOSFET includes drain and source terminals coupled between said signal node and said second supply node.

15. An apparatus as recited in claim 10, wherein said N-MOSFET includes a gate terminal for receiving a complement of said first clock signal.

16. An apparatus as recited in claim 1, wherein said first and second circuits together include a plurality of MOSFETs for operation with a power supply voltage of less than 3.5 volts.

17. An apparatus as recited in claim 1, further comprising an integrated circuit into which said dynamic logic circuit is integrated.

18. An apparatus as recited in claim 1, further comprising a computer into which said dynamic logic circuit is incorporated.

19. A method as recited in claim 6, wherein said second circuit is further for receiving a second data signal and a second clock signal with second active and inactive clock states and in response thereto coupling said signal node to said second supply node at said second voltage level during said second active clock state, and wherein said first circuit is further for becoming reversed biased and thereby substantially maintaining said second voltage level at said signal node when said second clock signal transitions from said second active clock state to said second inactive clock state.

20. A method as recited in claim 6, further comprising the step of providing an integrated circuit into which said dynamic logic circuit is integrated.

21. A method as recited in claim 6, further comprising the step of providing a computer into which said dynamic logic circuit is incorporated.

22. A method as recited in claim 21, further comprising the steps of:

receiving a second data signal and a second clock signal with second active and inactive clock states and in response thereto coupling said signal node to said second supply node at said second voltage level during said second active clock state; and reversed biasing and thereby substantially maintaining said second voltage level at said signal node when said second clock signal transitions from said second active clock state to said second inactive clock state.

23. A method as recited in claim 7, further comprising the step of performing the recited steps within an integrated circuit.

24. A method as recited in claim 7, further comprising the step of performing the recited steps within a computer.

* * * * *

UNITED STATES PATENT AND TRADEMARK OFFICE
CERTIFICATE OF CORRECTION

PATENT NO.: 5,606,270
DATED: February 25, 1997
INVENTOR(S): GODFREY P. D'SOUZA ET AL.

It is certified that error appears in the above-identified patent and that said Letters Patent is hereby corrected as shown below:

In Col. 10, line 22, delete "21" and replace with --7--.

Signed and Sealed this

Thirteenth Day of May, 1997

*Attest:*

BRUCE LEHMAN

*Attesting Officer*    *Commissioner of Patents and Trademarks*